(12) United States Patent
Sunami et al.

(10) Patent No.: US 6,493,234 B2
(45) Date of Patent: Dec. 10, 2002

(54) ELECTRONIC COMPONENTS MOUNTING STRUCTURE

(75) Inventors: Ryoji Sunami, Tokyo (JP); Takahiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/983,098

(22) Filed: Oct. 23, 2001

(65) Prior Publication Data

US 2002/0051348 A1 May 2, 2002

(30) Foreign Application Priority Data

Oct. 30, 2000 (JP) ........................................ 2000-329877

(51) Int. Cl.[7] ............................. H05K 5/00; H05K 5/04; H05K 5/06
(52) U.S. Cl. ....................... 361/752; 361/760; 361/761; 361/783; 361/772; 361/774; 361/790; 174/260; 174/261
(58) Field of Search ................................ 361/760, 761, 361/752, 753, 775, 773, 772, 783, 790, 735, 774; 174/250, 260, 261

(56) References Cited

U.S. PATENT DOCUMENTS

| 4,819,042 A | * | 4/1989 | Kaufman ..................... 257/676 |
| 5,994,648 A | * | 11/1999 | Glovatsky et al. .......... 174/260 |
| 6,049,043 A | * | 4/2000 | Tonejc ........................ 174/250 |
| 6,283,769 B1 | * | 9/2001 | Asao et al. ................ 439/76.2 |

FOREIGN PATENT DOCUMENTS

| JP | 4-258158 | 9/1992 |
| JP | 10-209597 | 8/1998 |

* cited by examiner

*Primary Examiner*—Jayprakash N. Gandhi
*Assistant Examiner*—Thanh Y. Tran
(74) *Attorney, Agent, or Firm*—Oblon, Spivak, McClelland, Maier & Neustadt, P.C.

(57) ABSTRACT

According to the present invention, there is provided an electronic components mounting structure constituted by a plurality of electronic components having lead terminals respectively, and conductors having connection portions to be connected to the lead terminals of the electronic components, in which the lead terminals of the electronic components are aligned with the connection portions of the conductors and the lead terminals and the connection portions are welded with each other.

8 Claims, 7 Drawing Sheets

ELECTRONIC COMPONENTS MOUNTING STRUCTURE

BACKGROUND OF THE INVENTION

In place of a soldering method, the present invention provides an electronic components mounting structure in which in connection between electronic components and conductors, insulation between the conductors are performed efficiently, connection portions between the electronic components and the conductors are aligned so as to be welded easily, and the conductors are assembled in a stacked state so as to increase the mounting density.

In the background art, electrical connection of electronic components was performed in a manner so that the electronic components were mounted on a substrate and connected to wiring patterns formed on the substrate. In such a configuration, since the wiring patterns were formed with copper foil and current capacity was small, the configuration could not be used in a large current circuit. In such a case, it was required that, as shown in FIG. 12, a copper plate good in electrical conductivity and called a bus bar 111 was projected from an electrical circuit portion 110, and a top end of a lead terminal 101 of an electronic component 100 was passed through a hole 112 formed in the busbar 111 to make connection between the lead terminal 101 and the busbar 111 by soldering.

In a location with severe environment for use of automobiles or the like, reliability was lowered due to deterioration of soldering or the like, for example, cracks generated in a soldering portion, because of temperature change, vibrations or the like.

Further, from the viewpoint of the problem of environmental contamination in recent years so as to make the soldering free from lead, use of conventional solder is limited, and in order to promote recycling, it has become necessary to reconsider the solder connection.

Conventionally, connection to such busbars was performed by soldering. However, since copper was good in heat conduction, workability of soldering was poor. At the same time, such soldering was often made manually. These facts were primary factors causing increase in cost.

SUMMARY OF THE INVENTION

Accordingly, the present invention, therefore, provides an electronic components mounting structure for performing connection between lead of electronic components and metal conductors having large current capacity, in place of a soldering method, in which insulation between the metal conductors are performed efficiently, connection portions between the electronic components and the metal conductors are aligned so as to be subjected to connection work by welding or the like efficiently, and the metal conductors are assembled in a stacked state so as to improve assembling property and increase the mounting density.

The present invention will be described briefly with reference to FIG. 1. In FIG. 1, the reference numeral 1 represents a box casing; 2, cover casing; 3-1 and 3-2, first protrusion portions; 4-1 and 4-2, second protrusion portions; 5-1 to 5-3, third protrusion portions; 6 to 13, conductors; and 21 to 24, electronic components.

The first protrusion portions 3-1 and 3-2, the second protrusion portions 4-1 and 4-2, the third protrusion portions 5-1, 5-2 and 5-3 are formed on the box casing 1. Further, a first protrusion portion 2-1 for conductor holding is formed on the cover casing 2.

First, the first protrusion portions 3-1 and 3-2 of the box casing 1 are inserted into hole portions 6-1 and 6-2 of the conductor 6, the third protrusion portion 5-2 is inserted into a hole portion 7-1 of the conductor 7, the second protrusion portion 4-2 is inserted into a hole portion 7-2, the third protrusion portion 5-3 is inserted into a hole portion 7-3, the second protrusion portion 4-1 is inserted into a hole portion 9-1 of the conductor 9, and the third protrusion portion 5-1 is inserted into a hole portion 9-2, so that these conductors 6,7 and 9 are arranged to be insulated from each other and located in the lowest portion of the box casing 1.

Next, the second protrusion portions 4-1 and 4-2 are arranged so that the second protrusion portion 4-1 is inserted into a hole portion 8-1 of the conductor 8, and the second protrusion portion 4-2 is inserted into a hole portion 8-2. At this time, as shown in the left lower portion of FIG. 1, each of the hole portions 8-1 and 8-2 in the conductor 8 is formed in such a size that the conductor 8 is supported on a step portion 4A, and an insulation configuration is formed so that the conductor 8 does not come into contact with the conductors 6, 7 and 9 arranged in the lowest portion of the box casing 1.

Then, the second protrusion portion 4-1 is inserted into a hole portion 10-1 of the conductor 10. At this time, as shown in the left lower portion in FIG. 1, the hole portion 10-1 of the conductor 10 is formed in such a size that the conductor 10 is supported on a step portion 4B, and an insulation configuration is formed so that the conductor 10 does not come into contact with the conductors 9 and 8 arranged on lower and middle steps of the box casing 1.

Similarly, the first protrusion portion 3-1 is inserted into a hole portion 11-1 of the conductor 11. At this time, as shown in the right lower portion in FIG. 1, the hole portion 11-1 of the conductor 11 is formed in such a size that the conductor 11 is supported on a step portion 3B, and an insulation configuration is formed so that the conductor 11 does not come into contact with the conductors 6 and 8 arranged on lower and middle steps of the box casing 1. The conductors 12 and 13 are subjected to similar insulation arrangement.

The conductors are held by a first protrusion portion 2-1 formed to project from the cover casing 2 for conductor holding, as shown by way of example in the left lower and right lower portions of FIG. 1. Of course, other conductors are also pressed by protrusion portions not shown.

When the box casing 1 is covered with the cover casing 2, external connection terminals a to h, which are provided in the box casing 1 to be formed on the respective conductors for connection, project from external connection terminal inserting holes A to H so as to be electrically connected with an external circuit.

Lead terminals r, 1, t, ... of the electronic components 21 ... are formed on the respective conductors and aligned so as to be opposite to connection portions R, L, T ... located outside the box casing 1 and the cover casing 2, so that welding can be performed easily.

The problem can be achieved by the present invention in the following items (1)~(3).

(1) An electronic components mounting structure which has a plurality of electronic components (21, 22, 23, 24) having lead terminals respectively, and conductors (6, 7, 8, 9, 10, 11, 12, 13) having connection portions to be connected to the lead terminals of the electronic components, wherein the lead terminals of the electronic components (21, 22, 23, 24) are aligned with the connection portions of the conductors and the lead terminals and the connection portions are welded with each other.

(2) An electronic components mounting structure as stated in the item (1) which has a plurality of electronic components (21, 22, 23, 24) having lead terminals respectively, and conductors (6, 7, 8, 9, 10, 11, 12, 13) connected to the lead terminals, wherein the conductors are arranged in a resin casing so as to be insulated from each other, and wherein external connection terminals of the conductors which are not connected to the electronic components are collected on one and the same surface of the resin casing.

(3) In an electronic components mounting structure as stated in the item (1), protrusion portions (3-1, 3-2, 4-1, 4-2, 5-1, 5-2, 5-3) are provided at a part of the resin casing so that the conductors (6, 7, 8, 9, 10, 11, 12, 13) to be connected to the electronic components (21, 22, 23, 24) are assembled in a stacked state in the protrusion portions to thereby improve assembling density and workability of the electronic components.

In accordance with the above-mentioned items, the following operations and effects can be obtained.

(1) Since the lead terminals of the electronic components are aligned with the connection portions of the conductors, the lead terminals and the connection portions of the conductors are welded with each other sequentially and easily by using a welding device, so that the connection work by welding can be carried out very efficiently.

(2) Since the external connection terminals of the conductors which are not connected to the electronic components are collected on one and the same surface of the resin casing, a connector can be connected easily to the external connection terminals when a connection portion such as a control board is disposed on the resin casing.

(3) Since the protrusion portions are provided at a part of the resin casing so that the conductors are assembled in a stacked state in the protrusion portions, assembling density and workability of the electronic components are improved.

DETAILED DESCRIPTION OF THE PREFERRED EMBODIMENT

Figure 1:
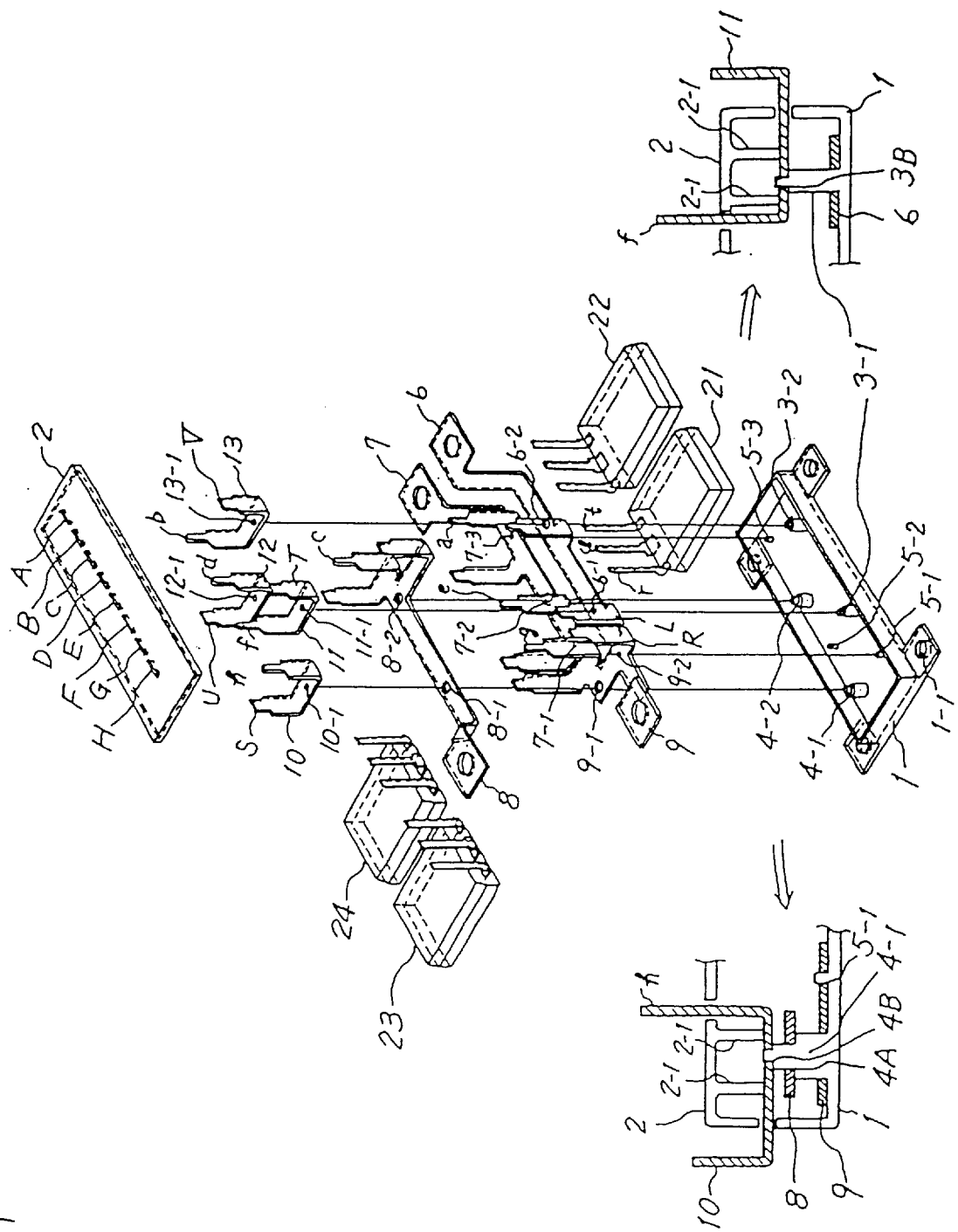
FIG. 1 is an explanation view of a perspective exploded assembly state for explaining the outline of amounting structure of electronic components according to the present invention.
Figure 2:
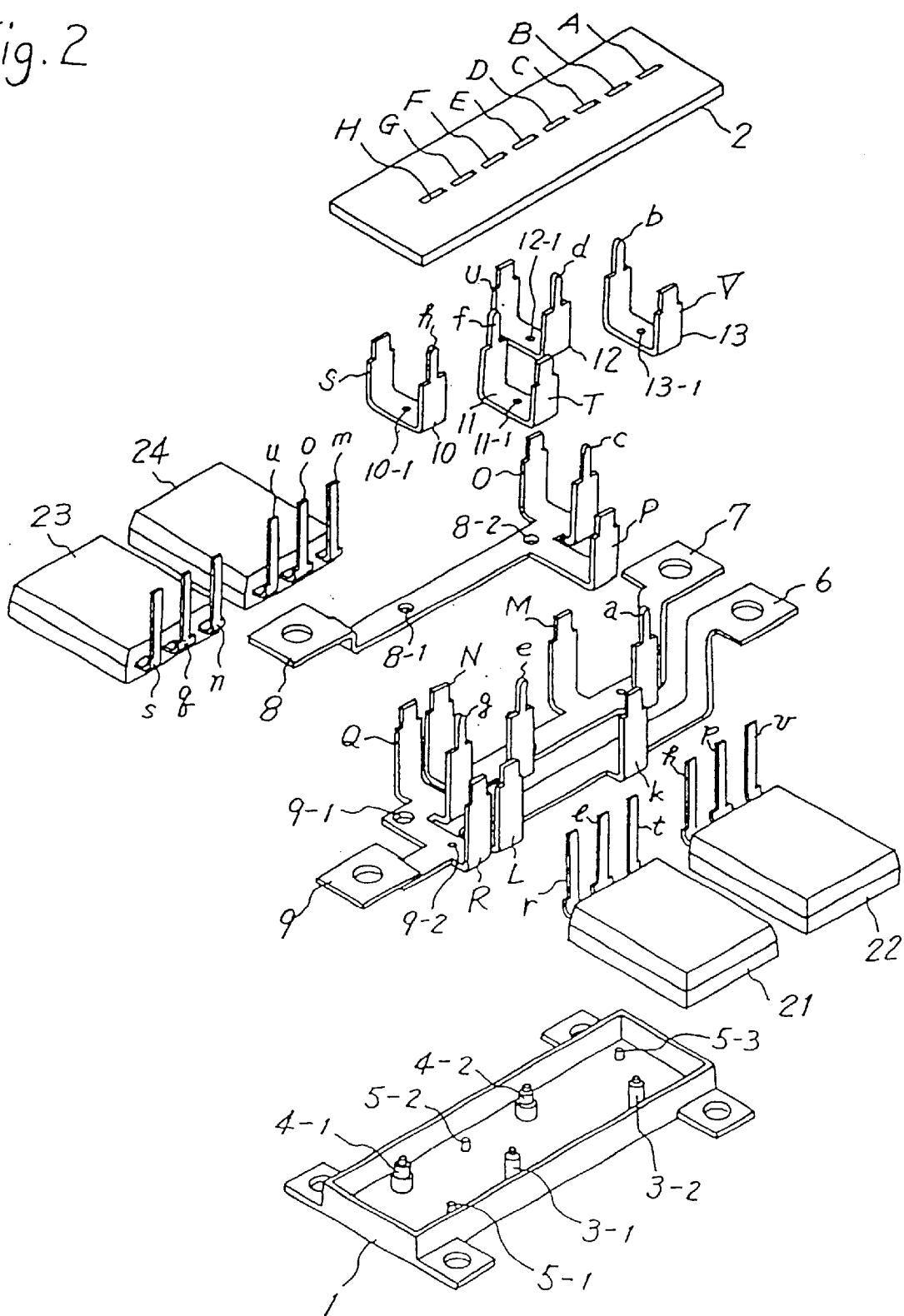
FIG. 2 is a perspective exploded view of the mounting structure according to the present invention.
Figure 3:
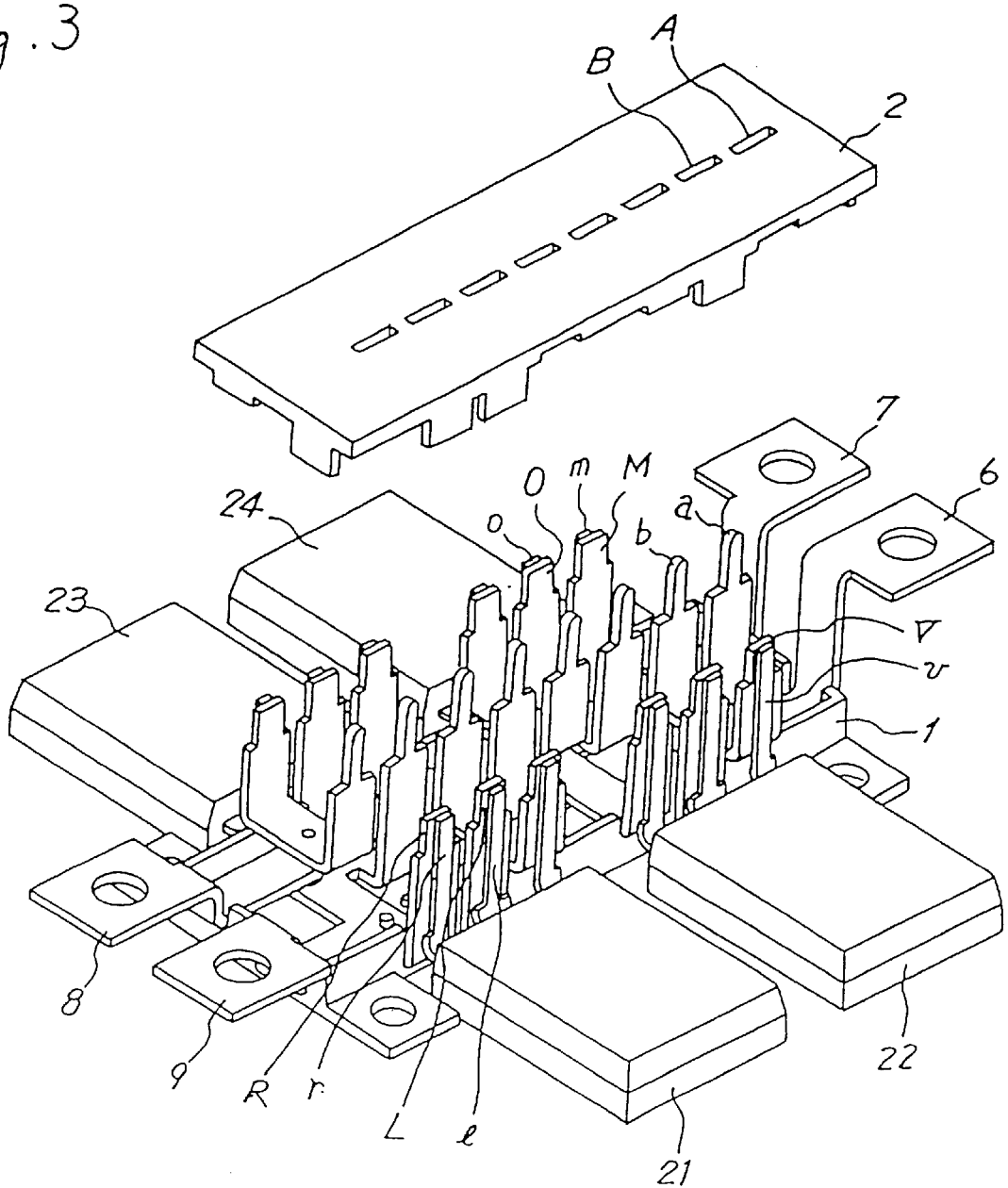
FIG. 3 is an interior mounting perspective view when a cover according to the present invention is removed.
Figure 4:
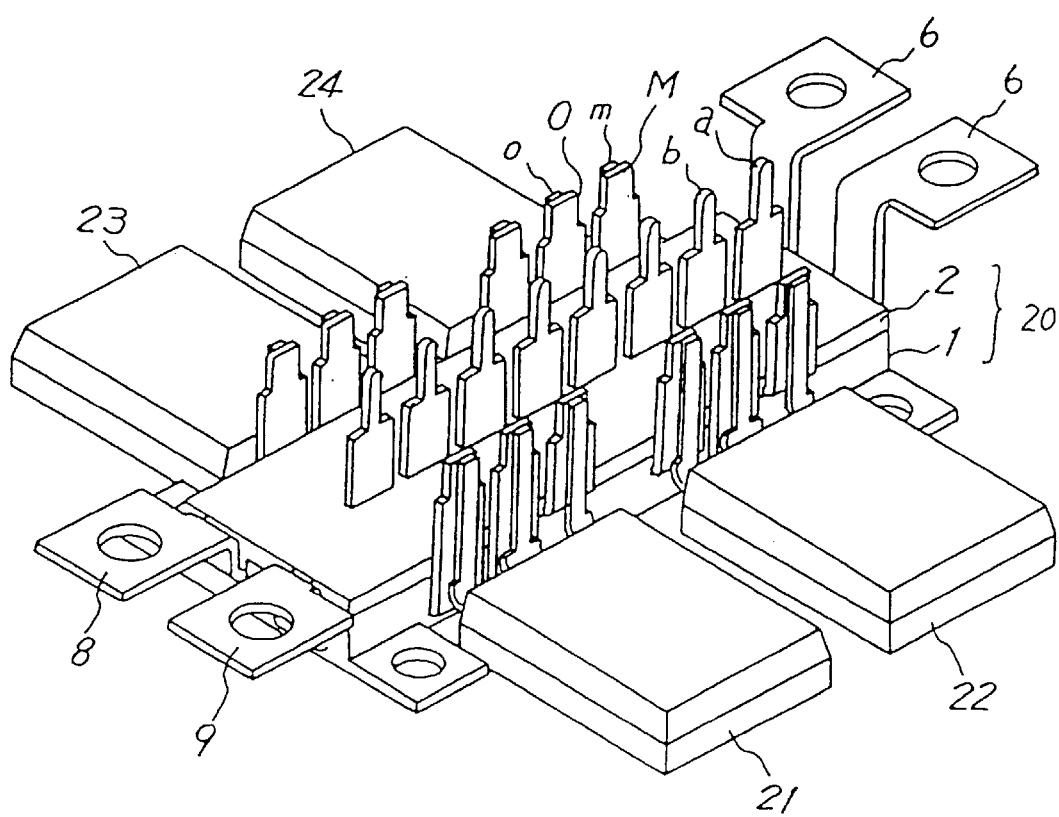
FIG. 4 is a perspective view of the mounting structure according to the present invention.
Figure 5A:
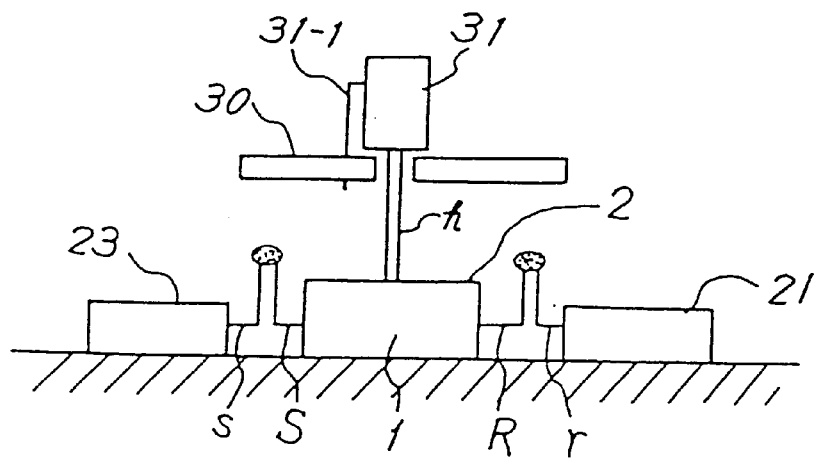
FIGS. 5A and 5B are views for explaining a connection state between an external connection terminal and a connector.
Figure 5B:
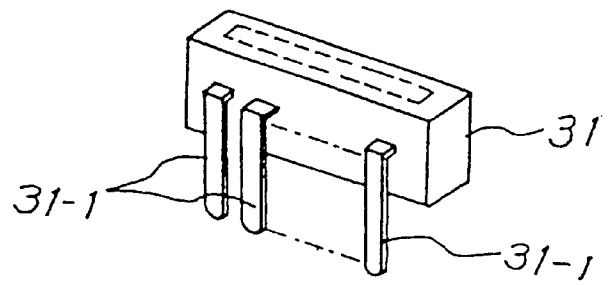
Figure 6:
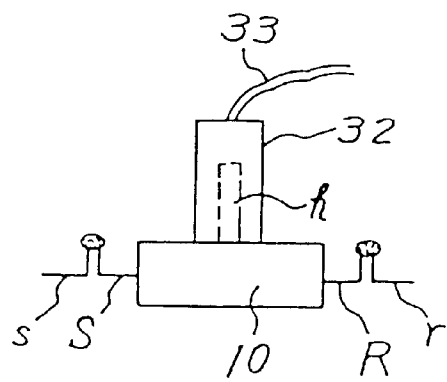
FIG. 6 is a view for explaining another connection state between an external connection terminal and a connector according to the present invention.
Figure 7:
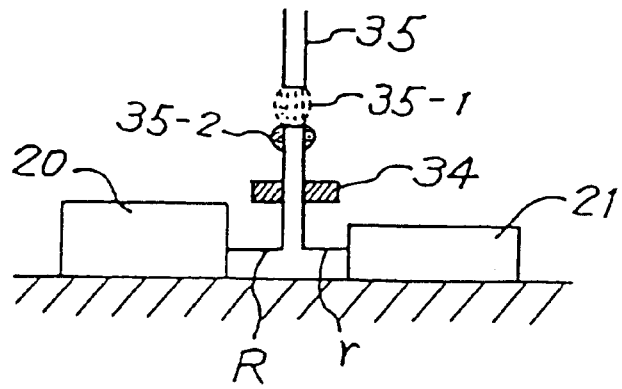
FIG. 7 is a view for explaining an arc welding method according to the present invention.
Figure 8:
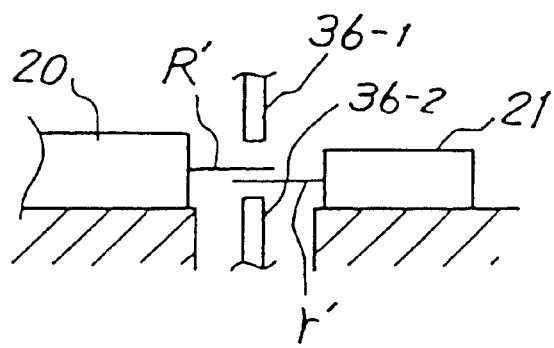
FIG. 8 is a view for explaining a resistance welding method according to the present invention.
Figure 9:
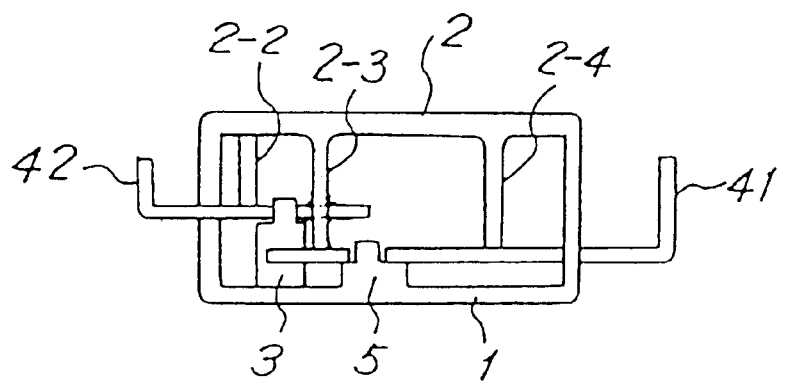
FIG. 9 is a sectional view of an interior mounting according to the present invention.
Figure 10:
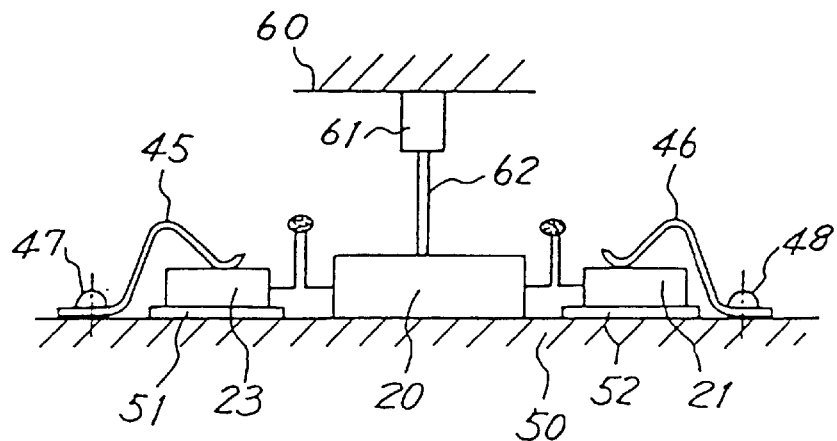
FIG. 10 is a view of attaching electronic components according to the present invention.
Figure 11:
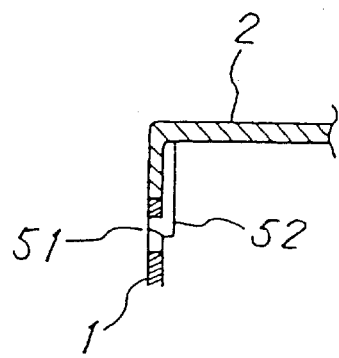
FIG. 11 is a view for explaining a connection state between the cover casing and the box casing according to the present invention.
Figure 12:
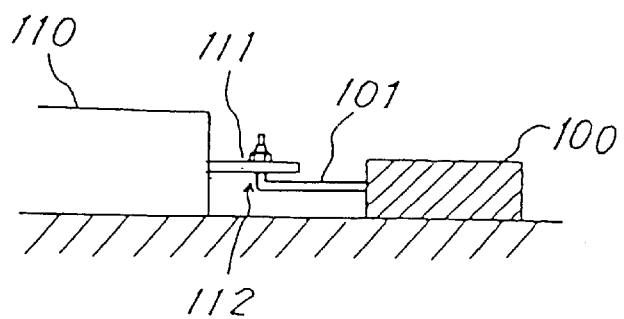
FIG. 12 is a view showing a background-art soldering connection.

An embodiment of the present invention will be described with referring to FIGS. 1 to 11. FIG. 1 is an explanation view of a perspective exploded assembly state for explaining the outline of a mounting structure of electronic components according to the present invention; FIG. 2 is a perspective exploded view of the mounting structure according to the present invention; FIG. 3 is an interior mounting perspective view when a cover according to the present invention is removed; FIG. 4 is a perspective view of the mounting structure according to the present invention; FIGS. 5A and 5B are views for explaining a connection state between an external connection terminal and a connector; FIG. 6 is a view for explaining another connection state between an external connection terminal and a connector according to the present invention; FIG. 7 is a view for explaining an arc welding method according to the present invention; FIG. 8 is a view for explaining a resistance welding method according to the present invention; FIG. 9 is a sectional view of an interior mounting according to the present invention; FIG. 10 is a view of attaching electronic components according to the present invention; and FIG. 11 is a view for explaining a connection state between the cover casing and the box casing according to the present invention.

In the drawings, the reference numeral 1 represents a box casing; 2, cover casing; 3-1 and 3-2, first protrusion portions; 4-1 and 4-2, second protrusion portions; 5-1 to 5-3, third protrusion portions; 6 to 13, conductors; 20, casing; 21 to 24, electronic components; 30, a control circuit board; 31 and 32, connectors; A to H, external connection terminal inserting holes; and a to h, external connection terminals.

The box casing 1 and the cover casing 2 constitute a casing 20. In the casing 20, a large number of conductors 6 to 13 are arranged in the condition that the conductors 6 to 13 are insulated from each other. The box casing 1 and the cover casing 2 are formed of resin such as polybutylterephthalate (PBT).

On the box casing 1, there are formed the first protrusion portions 3-1 and 3-2, the second protrusion portions 4-1 and 4-2, and the third protrusion portions 5-1, 5-2, and 5-3.

As shown with the 3-1 in the right lower portion of FIG. 1, the first protrusion portions 3-1 and 3-2 are provided to hold the stack of two conductors, for example, conductors 6 and 11, insulated from each other. In each of the first protrusion portions 3-1 and 3-2, a step portion 3B is formed. In the example of the first protrusion portion 3-1 as shown in the right lower portion of FIG. 1, the conductors 6 and 11 are arranged on the lower and upper steps respectively. A hole portion 11-1 of the conductor 11 is located in the step portion 3B. The conductor 11 is inserted into the step portion 3B of the first protrusion portion 3-1 and held by the protrusion portions 2-1 and 2-1 formed on the cover casing 2 for conductor holding. The first protrusion portion 3-1 is inserted into the hole portion 6-1 of the conductor 6 and held by the not-shown protrusion portions formed on the cover casing 2 for conductor holding. Incidentally, the first protrusion portion 3-2 is inserted into the hole portion 6-2 of the conductor 6, and the step portion of the first protrusion portion 3-2 is inserted into the hole portion 13-1 of the conductor 13. Those inserted in the hole portions are held similarly to the manner mentioned above.

In the second protrusion portion 4-1 formed on the box casing 1, as shown in the left lower portion of FIG. 1, the conductors 9, 8 and 10 are arranged on the lower, intermediate and upper steps respectively. Step portions 4A and 4B are formed in the second protrusion portion 4-1. The lowest portion of the second protrusion portion 4-1 is inserted into the hole portion 9-1 of the conductor 9, the step portion 4A of the second protrusion portion 4-1 is inserted into the hole portion 8-1 of the conductor 8, and the step portion 4B of the second protrusion portion 4-1 is inserted into the hole portion 10-1 of the conductor 10. Thus, on the second protrusion portion 4-1, the conductors 9, 8 and 10 are stacked in three steps, and held to be insulated from each other. The conductor 10 is held by the protrusion portions 2-1 and 2-1 formed on the cover casing 2 for conductor holding. Also the conductors 8 and 9 are held by the not-shown conductor pressing protrusion portions similarly to the manner mentioned above. Incidentally, the third protrusion portion 5-1 is inserted into the hole portion 9-2 of the conductor 9.

Similarly, other conductors is insulated from each other and held by the box casing 1 and the cover casing 2.

In the cover casing 2, external connection terminal inserting holes (hereinafter referred to as "insertion hole") A to H are formed.

In order to locate the connection portions or the like of the conductors 6 to 13 outside the box casing 1 and the cover casing 2 as shown in FIGS. 3 and 4, actually, there are a plurality of concave and convex portions formed in the box casing 1 and the cover casing 2. In order to simplify the explanation, in the perspective exploded views shown in FIGS. 1 and 2, these concave and convex portions are however omitted here.

In the conductor 6, a connection portion L to be connected to the lead terminal l of the electronic component 21 and a connection portion K to be connected to the lead terminal k of the electronic component 22 are formed, and hole portions 6-1 and 6-2 are provided.

In the conductor 7, a connection portion N to be connected to the lead terminal n of the electronic component 23, a connection portion M to be connected to the lead terminal m of the electronic component 24, and external connection terminals a and e are formed, and hole portions 7-1 and 7-2 are provided.

In the conductor 8, a connection portion P to be connected to the lead terminal p of the electronic component 22, a connection portion O to be connected to the lead terminal o of the electronic component 24, and an external connection terminal care formed, and hole portions 8-1 and 8-2 are provided.

In the conductor 9, a connection portion R to be connected to the lead terminal r of the electronic component 21, a connection portion Q to be connected to the lead terminal q of the electronic component 23, and an external connection terminal g are formed, and hole portions 9-1 and 9-2 are provided.

In the conductor 10, a connection portion S to be connected to the lead terminal s of the electronic component 23 and an external connection terminal h are formed, and a hole portion 10-1 is provided.

In the conductor 11, a connection portion T to be connected to the lead terminal t of the electronic component 21 and an external connection terminal f are formed, and a hole portion 11-1 is provided.

In the conductor 12, a connection portion U to be connected to the lead terminal u of the electronic component 24 and an external connection terminal d are formed, and a hole portion 12-1 is provided.

In the conductor 13, a connection portion V to be connected to the lead terminal v of the electronic component 22 and an external connection terminal b are formed, and a hole portion 13-1 is provided.

These conductors 6 to 13 maybe constituted, for example, by a copper plate so as to be able to make a large current flow, to be welded, and to be connected to a connector easily. The connection portions and external connection terminals are formed respectively to be bent at 90 degrees from conductors.

The electronic components 21 to 24 are semiconductor components, for example, large current FETs.

According to the present invention, when the conductors 6 to 13 are arranged in the casing 20 constituted by the box casing 1 and the cover casing 2, first, the conductors 6, 7 and 9 are arranged on the first protrusion portions 3-1 and 3-2, the second protrusion portions 4-1 and 4-2, and the third first protrusion portions 5-1, 5-2 and 5-3 formed on the box casing 1. Then, the conductor 8 and then the conductors 10 to 13 are arranged sequentially. Finally, the cover casing 2 and the box casing 1 are sealed to each other while the external connection terminals a to h projects out of the insertion holes A to H of the cover casing 2. Thus, the external connection terminals a to h can be collected on one and the same surface and then projected out.

At this time, as shown in FIG. 11, a hook 52 is provided on the cover casing 2 so that the hook 52 engages with a hole 51 formed in the box casing 1, and the casings 1 and 2 are firmly fixed with each other. In order to prevent the conductors 6 to 13 from floating or being displaced, the conductor holding protrusion portions 2-2, 2-3, 2-4, and so on, are provided on the cover casing 2, as described in the example shown in FIG. 9, so that the conductors 6 to 13 are arranged surely in the protrusion portions respectively.

Thus, according to the present invention, the conductors are made to fall into the box casing 1 one by one successively so that the conductors can be assembled easily and the number of steps of the assembling work can be reduced.

When the assembly is completed thus, the connection portions K, L, M . . . of the conductors are located to be bent at right angles toward the outside of the box casing 1 and the cover casing 2. Since the lead terminals k, l, m . . . of the electronic components are also bent at right angles, the lead terminals r, l . . . of the electronic component 21 and the connection portions R, L . . . are subjected to positioning by means of jigs not shown and are connected to each other by arc welding as shown in FIG. 7.

At this time, the lead terminal r and the connection portion R are connected to the earth potential by a chuck 34 and held by the same chuck. By an arc 35-1 of an arc electrode 35, an area 35-2 in the lead terminal r and the connection portion R is welded. Since the lead terminal r and the connection portion R are at the earth potential, no voltage is applied to the electronic component 21 and the casing 20 to cause any bad influence. Thus, the lead terminals of the electronic component 21 to 24 can be arc-welded with respectively corresponding connection portions. Further, since the connection portions and the lead terminals are aligned at the same height and in the same direction, the alignment can be made so that the welding can be performed easily.

Of course, the welding can be performed easily even if these connection portions and the lead terminals are disordered to some extent in the alignment. Further, if the connection portions and the lead terminals are aligned so that they are perpendicular to each other, the same effect can be obtained.

The connection between the lead terminals and the connection portions according to the present invention is not limited to the arc welding, but they can be welded by resistance welding by use of the electrodes 36-1 and 36-2 if the lead terminal r' and the connection portion R' as shown in FIG. 8 are aligned without being bent at right angles. Of course, any other welding method can be applied.

The external connection terminals a to h projecting out of the insertion holes A to H of the cover casing 2 are, as shown in FIG. 5A, connected to a control circuit board 30 which is arranged above the external connection terminals a to h. For example, a connector 31 to be connected to the external connection terminals a to h is provided on the circuit board 30, and the external connection terminals a to h are inserted into and connected to the connector 31. As shown in FIGS. 5A and 5B, the terminals 31-1 of the connector 31 are connected by soldering to the circuit on the circuit board 30. Incidentally, FIGS. 5A and 5B show that the lead terminals r and s of the electronic components 21 and 23 are connected to the connection portions R and S by arc welding.

As connection means to the external connection terminals, a connector 32 may be used to perform connection through a cable 33, as shown in FIG. 6.

Actually, in use, the electronic components 21 to 24 generate heat due to loss. Accordingly, it is preferable that, as shown in FIG. 10 with the electronic components 21 and 23 as representatives, screws 47 and 48 are screwed against the base 50 through insulating plates 51 and 52 by using elastic supports 45 and 46.

Any partition may be provided in the box casing 1 if necessary. Further, the protrusion portions 2-1, 2-2, . . . for conductor pressing may be provided for all the conductors, or alternatively, may be provided for selected ones of the conductors.

According to the present invention, the following effects can be obtained.

(1) Since lead terminals of electronic components are aligned with connection portions of conductors, the lead terminals and the connection portions of the conductors are welded with each other sequentially and easily by using a welding device, so that connection work by welding can be carried out very efficiently.

(2) Since external connection terminals of the conductors which are not connected to the electronic components are collected on one and the same surface of a resin casing, a connector can be connected easily to the external connection terminals when a connection portion such as a control board is disposed on the resin casing.

(3) Since a protrusion portion is provided at a part of the resin casing so that the conductors are assembled in a stacked state in the protrusion portion, assembling density and workability of the electronic components are improved.

What is claimed is:

1. An electronic components mounting structure, comprising:

a plurality of electronic components each including at least one lead terminal; and conductors having connection portions to be connected to said at least one lead terminal and having external connection terminals;

wherein said lead terminals of said electronic components are aligned with said connection portions of said conductors, and said at least one lead terminal and said connection portions are welded to each other;

wherein the external connection terminals are not connected to said electronic components and are collected on one and the same surface of said casing so as to be electrically connected to an external circuit.

2. The electronic components mounting structure according to claim 1, wherein said conductors are arranged in a resin casing so as to be insulated from each other.

3. The electronic components mounting structure according to claim 2, wherein a protrusion portion is provided at a part of said resin casing so that said conductors are assembled in a stacked state in said protrusion portion.

4. An electronic components mounting structure, comprising:

conductors including connection portions configured to be connected to lead terminals of electronic components; and a casing having at least one protrusion portion supporting said conductors in a stacked state such that said connection portions have predetermined spacings.

5. The electronic components mounting structure according to claim 4, wherein the casing is made of a resin and said conductors are arranged in said casing thereby insulated from each other.

6. The electronic components mounting structure according to claim 4, wherein said at least one external connection terminal is collected on one surface of said casing so as to be electrically connected to an external circuit.

7. The electronic components mounting structure according to claim 4, wherein said casing includes a cover member and a box member, and said at least one protrusion portion is disposed on at least one of said box member and said cover member.

8. The electronic components mounting structure according to claim 7, wherein said cover member includes cutouts, and said cover member and said box member are sealed to each other to form insertion holes at the cutouts through which said at least one external connection terminal extends.

* * * * *